(12) United States Patent
Lin

(10) Patent No.: US 8,642,485 B2
(45) Date of Patent: Feb. 4, 2014

(54) METHOD FOR FABRICATING PATTERNED POLYIMIDE FILM AND APPLICATIONS THEREOF

(75) Inventor: Chin-Yi Lin, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 13/517,804

(22) Filed: Jun. 14, 2012

(65) Prior Publication Data

US 2013/0334625 A1 Dec. 19, 2013

(51) Int. Cl.
*H01L 21/302* (2006.01)

(52) U.S. Cl.
USPC .................. 438/745; 438/780; 257/E21.219

(58) Field of Classification Search
USPC ........................... 438/745, 780; 257/E21.219
See application file for complete search history.

(56) References Cited

U.S. PATENT DOCUMENTS

| | | | |
|---|---|---|---|
| 5,545,897 A * | 8/1996 | Jack ......................... | 250/339.13 |
| 5,667,922 A | 9/1997 | Martiska et al. | |
| 2012/0025383 A1* | 2/2012 | Daubenspeck et al. ....... | 257/762 |

\* cited by examiner

*Primary Examiner* — Trung Q Dang
(74) *Attorney, Agent, or Firm* — WPAT, PC; Justin King

(57) ABSTRACT

A method for fabricating a patterned polyimide film, wherein the method comprises steps as follows: Firstly, a polyimide film is provided on a substrate. A wet planarization process is then performed to remove a portion of the polyimide film. Subsequently the planarized polyimide film is patterned.

8 Claims, 12 Drawing Sheets

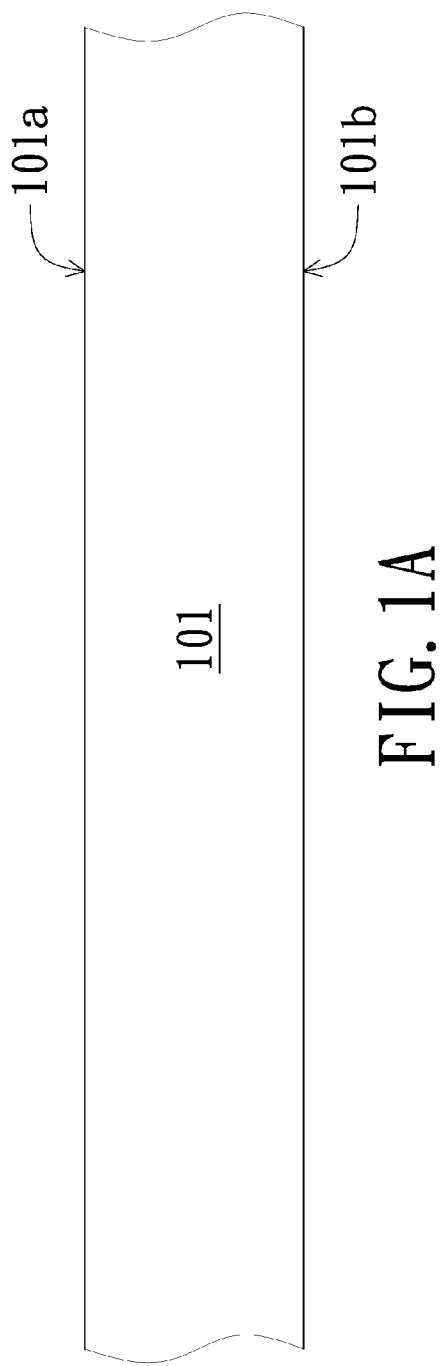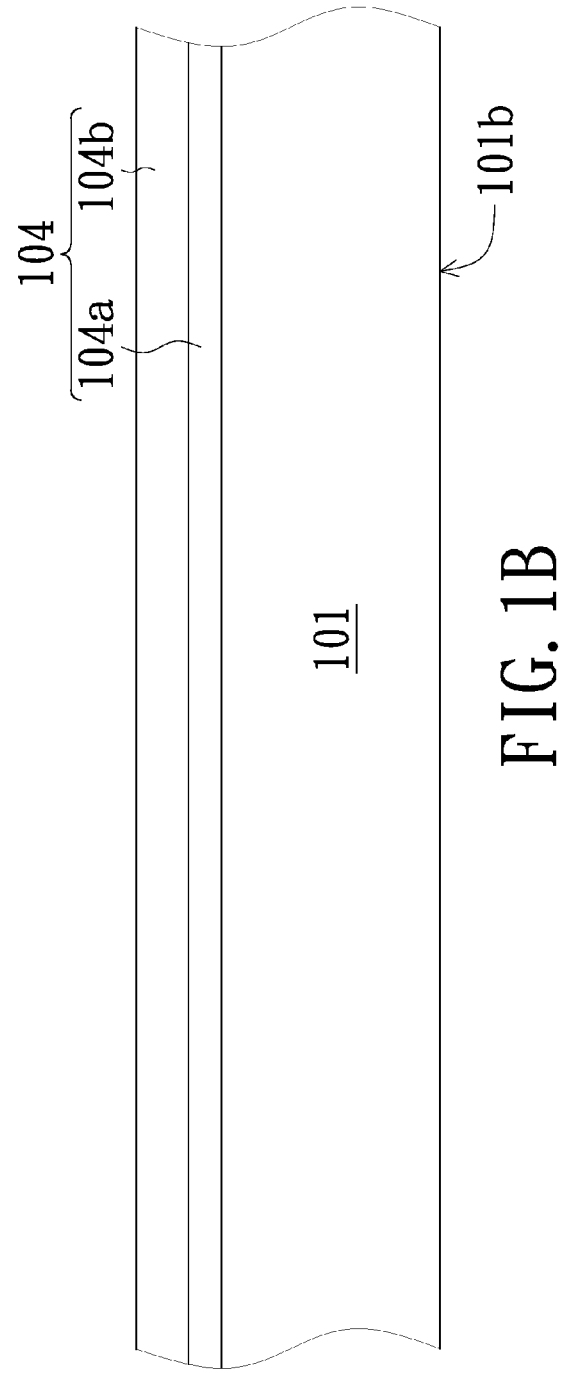

METHOD FOR FABRICATING PATTERNED POLYIMIDE FILM AND APPLICATIONS THEREOF

FIELD OF THE INVENTION

The present invention relates to a semiconductor device and the method for fabricating the same, and more particularly to a method for fabricating a patterned polyimide film and the applications thereof.

BACKGROUND OF THE INVENTION

Polyimide films which have a lower dielectric constant, are more amenable to film processing, and include a wide variety of chemistries that can be chosen to meet the functional requirements for different applications, concurrently have been widely used in the microelectronics industry for fabricating semiconductor devices, such as a micro-electro-mechanical system (MEMS). Typically, a polyimide film is utilized in semiconductor devices as an insulator layer, an interlayer dielectric (ILD and a passivation layer for various types of metallurgy.

However, since polyimide films have rugged surface topography and high reflection index, thus the pattern of a photo-resist which is formed on the polyimide film may be deformed after a development step is carried out during a photolithography process. Such that, the performance of the photolithography process and the subsequent processes carried out thereon may be deteriorated.

Therefore, there is a need to provide an advanced method for fabricating a patterned polyimide film to obviate the drawbacks and problems encountered from the prior art.

SUMMARY OF THE INVENTION

Therefore, one aspect of the present invention is to provide a method for fabricating a patterned polyimide film, wherein the method comprises steps as follows: Firstly, a polyimide film is provided on a substrate. A wet planarization process is then performed to remove a portion of the polyimide film. Subsequently the planarized polyimide film is patterned.

In one embodiment of the present invention, the polyimide film is provided by a spin coating followed by a curing step.

In one embodiment of the present invention, the wet planarization process comprises performing a surface treating process to make the polyimide film being subjected to an agent comprising N-methylpyrrolidone (NMP), 8-Quinolinol, N-N Dimethylacetamide, N-Methylethanolamide, dimethylformamide (DMF), m-cresol, tetrahydrofuran (THF), chloroform, butyrolactone, cycloxanone, acetone or the arbitrary combination thereof.

In one embodiment of the present invention, the process for patterning the planarized polyimide film comprises steps of forming a patterned photo-resist layer on the planarized polyimide film and removing a portion of the planarized polyimide film by using the patterned photo-resist layer as an etching mask.

In one embodiment of the present invention, the process for patterning the planarized polyimide film further comprises steps of providing a bottom anti-reflective coating (BARC) layer disposed between the planarized polyimide film and the patterned photo-resist layer.

In one embodiment of the present invention, the process for patterning the planarized polyimide film further comprises steps of providing a top-anti-reflective coating (TARC) layer on the patterned photo-resist layer In one embodiment of the present invention, a dry etching process or a wet etching process is adopted to remove the portion of the planarized polyimide film.

In one embodiment of the present invention, the patterned polyimide film may serve as a sacrifice film for forming a micro-microphone or as a resonance film of the micro-microphone.

In one embodiment of the present invention, the polyimide film is a photo-insensitive film.

Another aspect of the present invention is to provide a semiconductor device comprising a substrate and a polyimide film formed on the substrate, wherein the polyimide film has a surface topographical difference substantially less than 500 Å. In one embodiment of the present invention, the surface topographical difference has a standard deviation substantially less than 283 Å.

In one embodiment of the present invention, the semiconductor device further comprises a micro-microphone structure in which the polyimide film servers as a resonance film of the micro-microphone structure.

In one embodiment of the present invention, the polyimide film is a photo-insensitive film.

In accordance with aforementioned embodiments, a method for fabricating a patterned polyimide film of a semiconductor is provided, wherein a wet planarization process is performed before a photolithographic process carried out on a polyimide film, so as to provide a planarized surface of the polyimide film allowing a photo-resist layer formed thereon, such that the pattern of the photo-resist defined by a subsequent development step may not be deformed, and the performance of the photolithography process for patterning the polyimide film and the subsequent processes carried out thereon may be improved. Therefore, the drawbacks and problems encountered from the prior art may be obviate, and the yield of the semiconductor device may be increased.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 1A through 1M illustrate cross-sectional views of a method for fabricating a MEMS micro-microphone device in accordance with one embodiment of the present invention.

DETAILED DESCRIPTION OF PREFERRED EMBODIMENTS

Figure 1C:
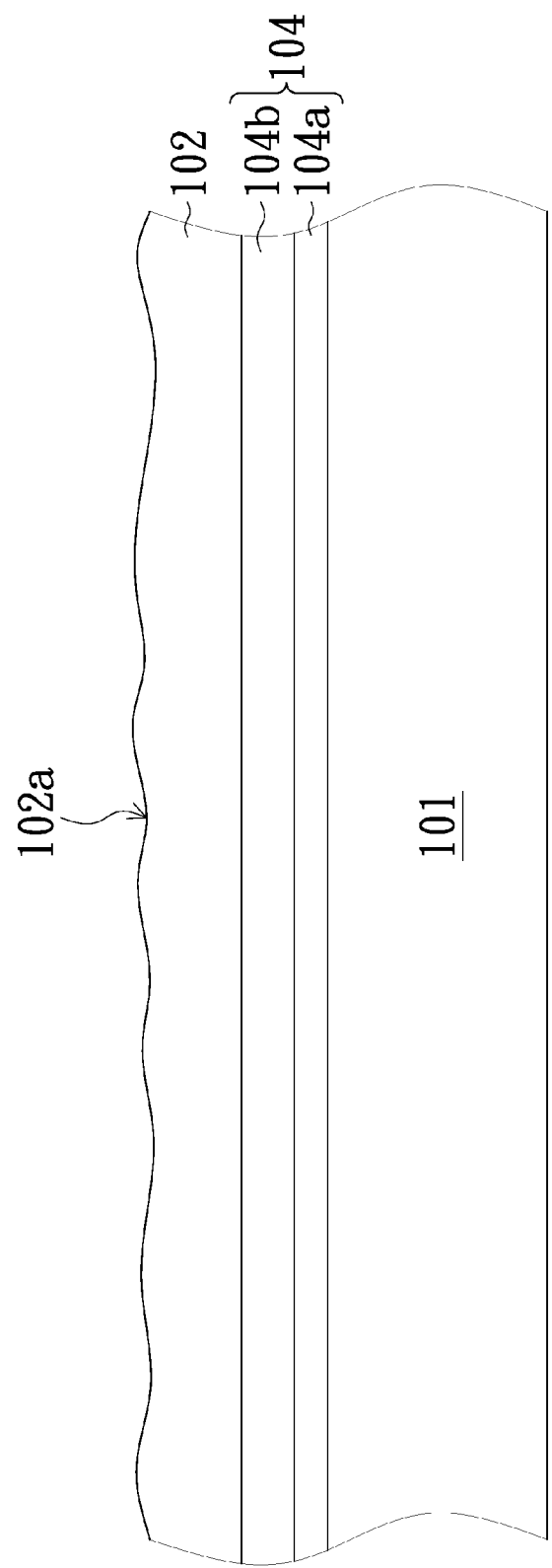
Figure 1D:
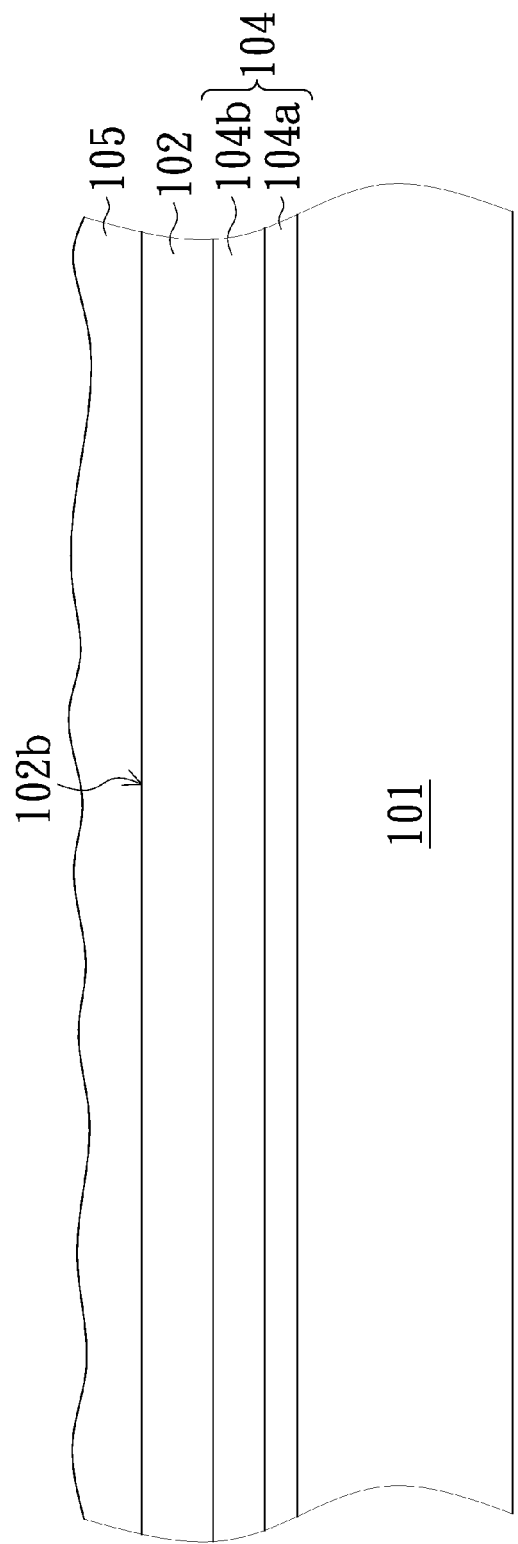

A method for fabricating a patterned polyimide film is provided to solve the problems of photo-resist layer deformation during the photolithographic process of pattering the polyimide film. The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A through 1M illustrate cross-sectional views of a method for fabricating a MEMS micro-microphone device 100 in accordance with one embodiment of the present invention. Wherein the method for fabricating the MEMS micro-microphone device 100 comprises steps as follows:

A substrate 101 is firstly provided (see FIG. 1A). In some embodiments of the present invention, the substrate 101 preferably is a silicon wafer. A base layer 104 is then formed on a surface 101a of the substrate 101. In some embodiments of the present invention, the base layer 104 comprises a silicon oxide layer 104a and a silicon nitride layer 104b stacked on the substrate 101 in sequence (see FIG. 1B).

Next, a patterned polyimide film 103 is then formed on the base layer 104, wherein the formation of the patterned polyimide film 103 comprises steps as follows: A polyimide film 102 is firstly formed on the base layer 104 by coating a photo-insensitive polyimide material on to the on the base layer 104 with spinner coating or chemical vapor deposition (CVD) (see FIG. 1C). After a curing step is carried out, a wet planarization process is then performed to remove a portion of the polyimide film 102 (see FIG. 1D). Subsequently, a photolithographic process is performed to remove a portion of the planarized polyimide film 102 to form the patterned polyimide film 103 (see FIG. 1F).

In some embodiments of the present invention, the wet planarization process comprises performing a surface treating process to make the surface 102a of the polyimide film 102 being subjected to an agent 105 comprising NMP, 8-Quinolinol, N-N Dimethylacetamide, N-Methylethanolamide, DMF, m-cresol, THF, chloroform, butyrolactone, cycloxanone, acetone or the arbitrary combinations thereof. In the present embodiment, the wet planarization process is carried out by immersing the surface 102a of the polyimide film 102 into the agent 105 for a period of time (see FIG. 1D), and then removing the agent 105.

Since polyimide can be resolved in the agent 105 comprising NMP, 8-Quinolinol, N-N Dimethylacetamide, N-Methylethanolamide, DMF, m-cresol, THF, chloroform, butyrolactone, cycloxanone, acetone or the arbitrary combinations thereof, thus while the surface 102a of the polyimide film 102 is immersed into the agent 105, a portion of the polyimide film 102 can be removed, and reflow may occur on the surface 102a of the polyimide film 102. Such that, a polanrized surface 102b of the polyimide film 102 can be obtained. In the present invention, the polanrized surface 102b of the polyimide film 102 resulted by the wet planarization process has a surface topographical difference substantially less than 500 Å, and the standard deviation of the surface topographical difference substantially less than 283 Å.

The process for patterning the planarized polyimide film 102 comprises steps as follows: A patterned photo-resist layer 119 is firstly formed on the polanrized surface 102b of the polyimide film 102. Subsequently, a reactive ion etching (RIE) or a hydrofluoric acid (HF) based wet etching is performed to remove a portion of the planarized polyimide film 102 by using the silicon nitride layer 104b as the stop layer, whereby the patterned polyimide film 103 as shown in FIG. 1F is formed.

Figure 1E:
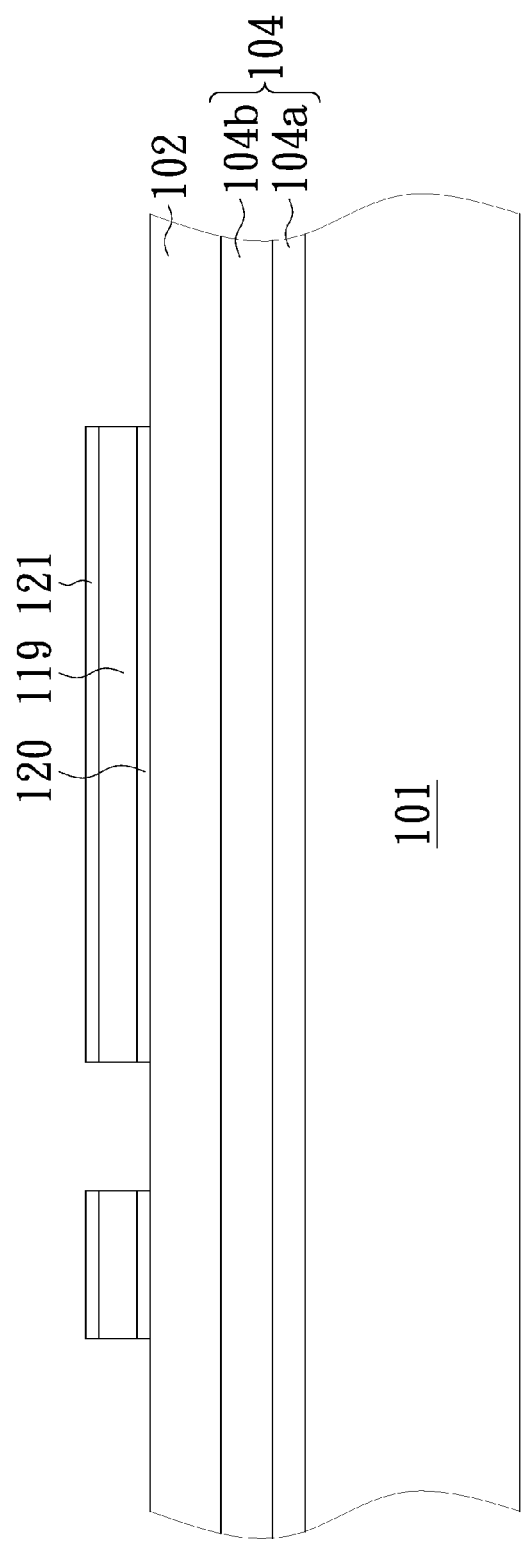
Figure 1F:
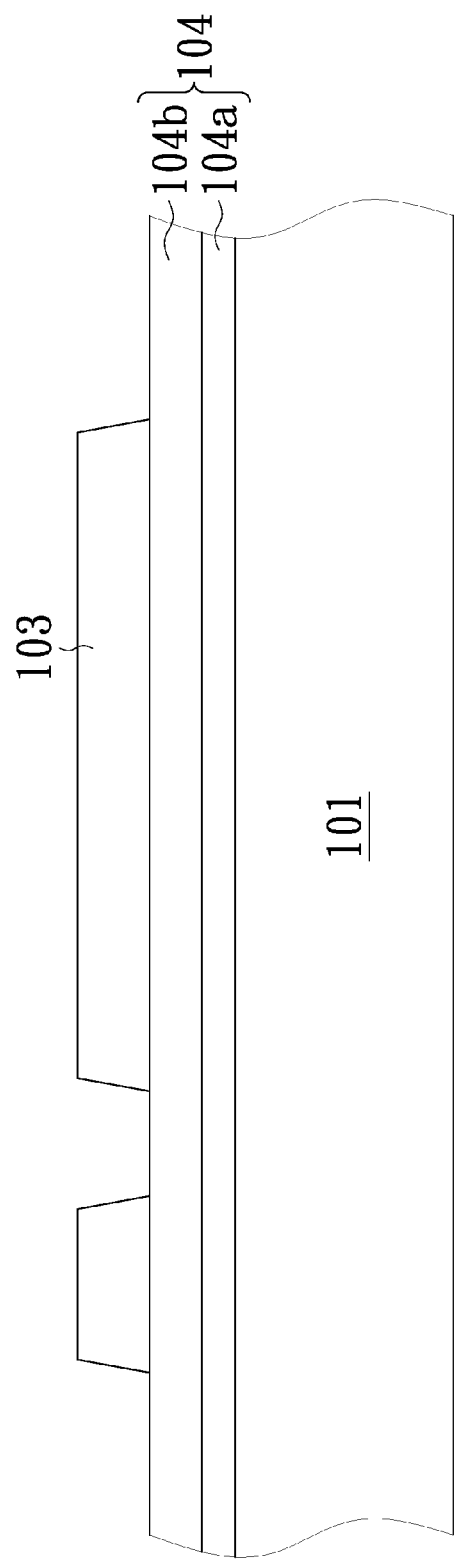
Figure 1G:
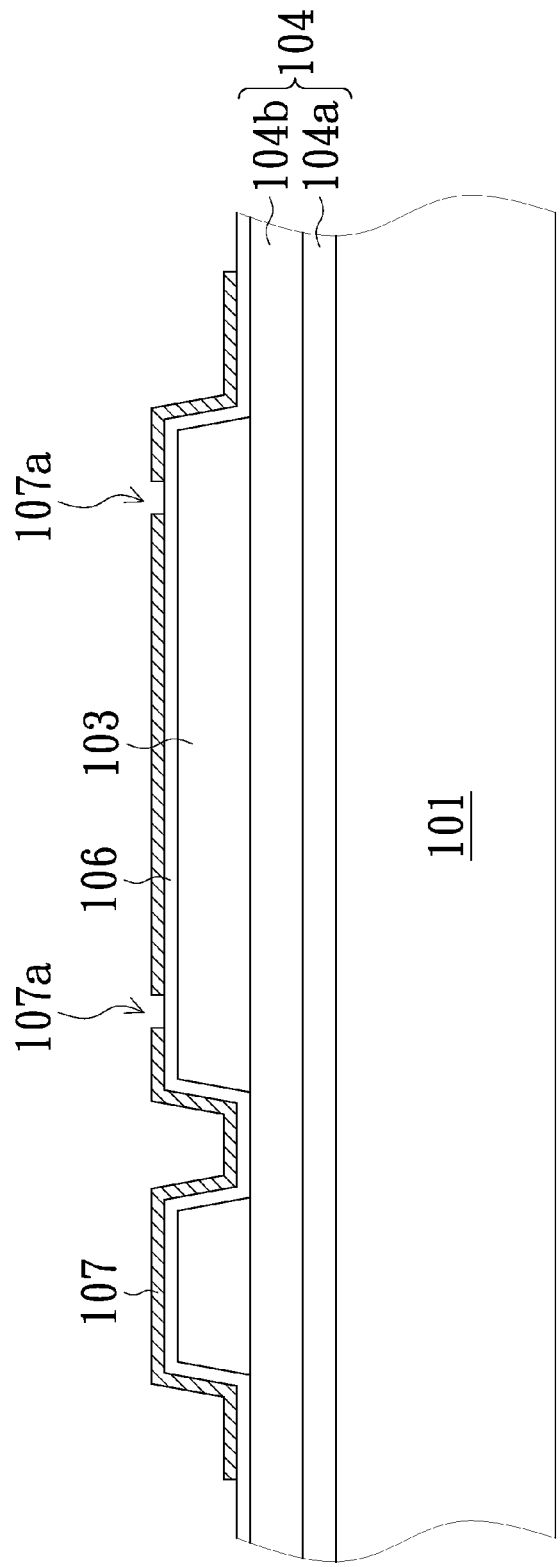

In order to improve the performance of the process for patterning the planarized polyimide film 102, in some preferred embodiments of the present invention, a BARC layer 120 disposed between the planarized polyimide film 102 and the patterned photo-resist layer 119 and a TARC layer disposed over the patterned photo-resist layer 119 may be further provided during the process for formation the patterned photo-resist layer 119 (see FIG. 1E).

After the formation of the patterned polyimide film 103, another silicon nitride layer 106 is formed to blanket over the patterned polyimide film 103 and the silicon nitride layer 104b. A patterned electrode layer 107 is then formed on the silicon nitride layer 106. In the present embodiment, the formation of the patterned electrode layer 107 comprises steps as follows: metal material is firstly evaporated onto the silicon nitride layer 106 to form a metal layer, such as a chrome/gold (Cr/Au) vapor deposition layer. A Photolithographic process is then performed to remove a portion of the metal layer, whereby the patterned electrode layer 107 having a plurality of openings 107a is formed on the silicon nitride layer 106 (see FIG. 1G).

Figure 1H:
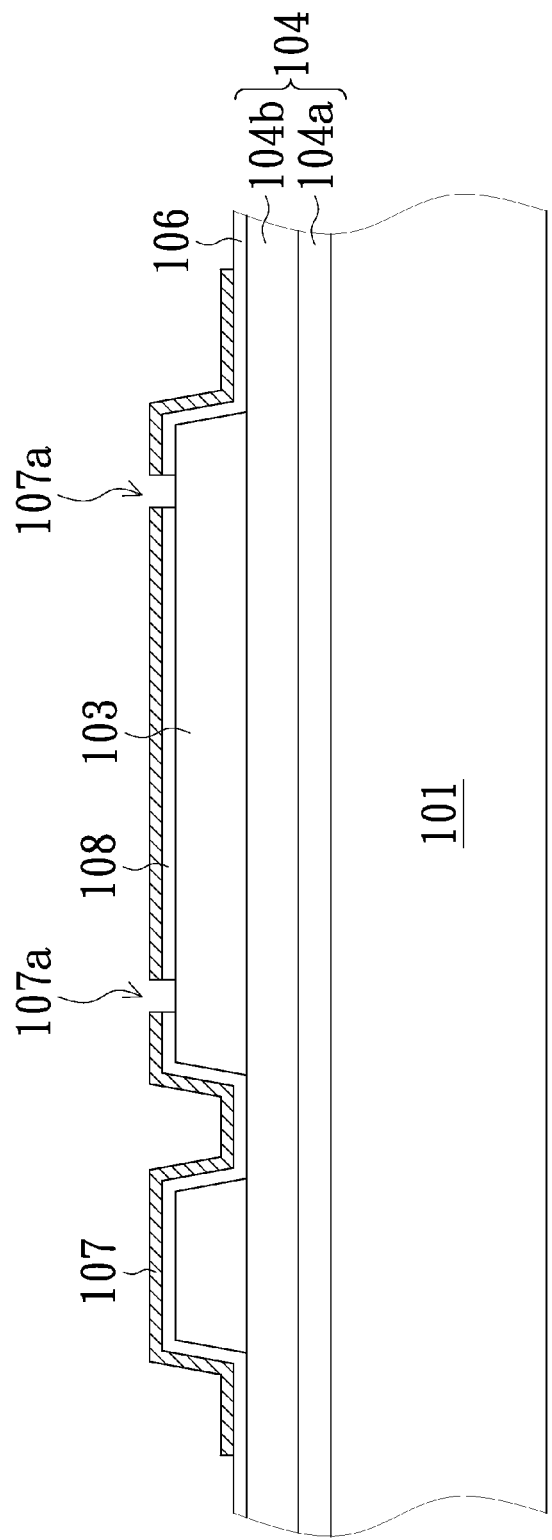
Figure 1I:
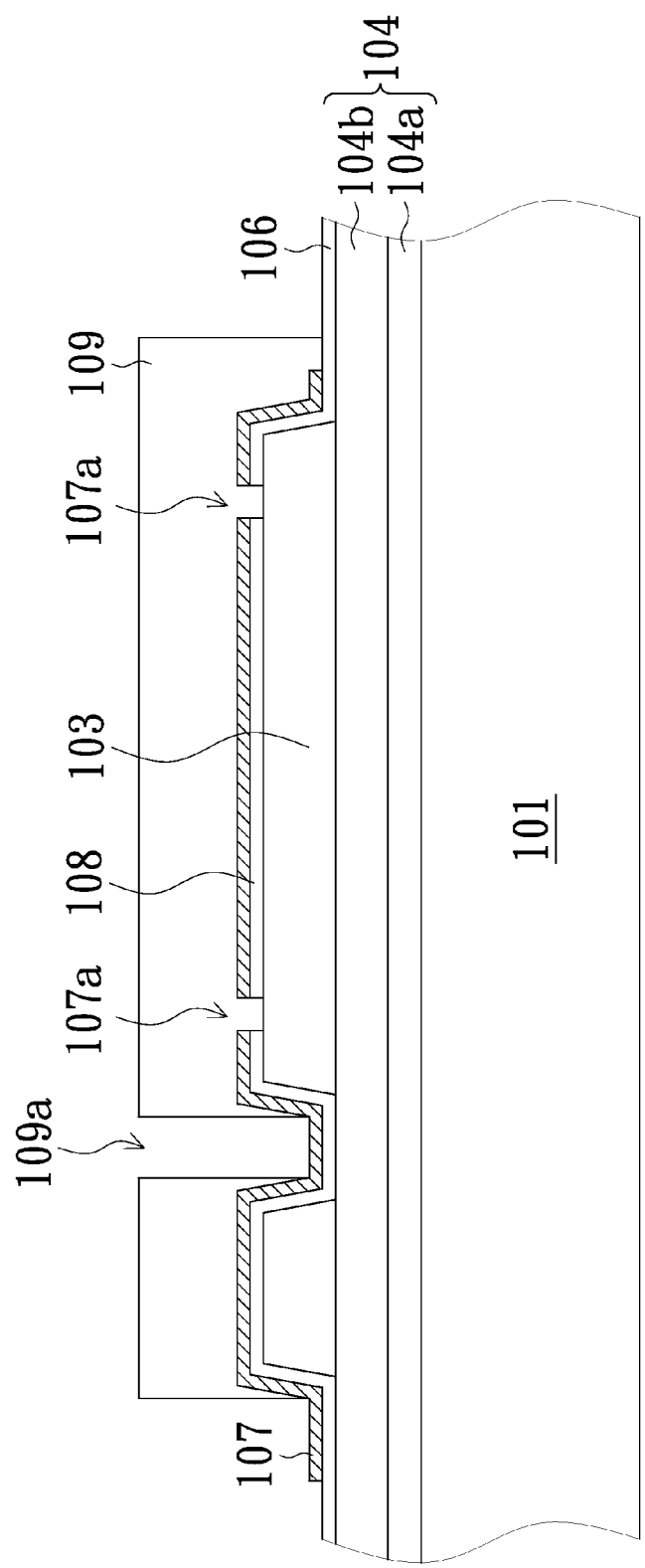
Figure 1J:
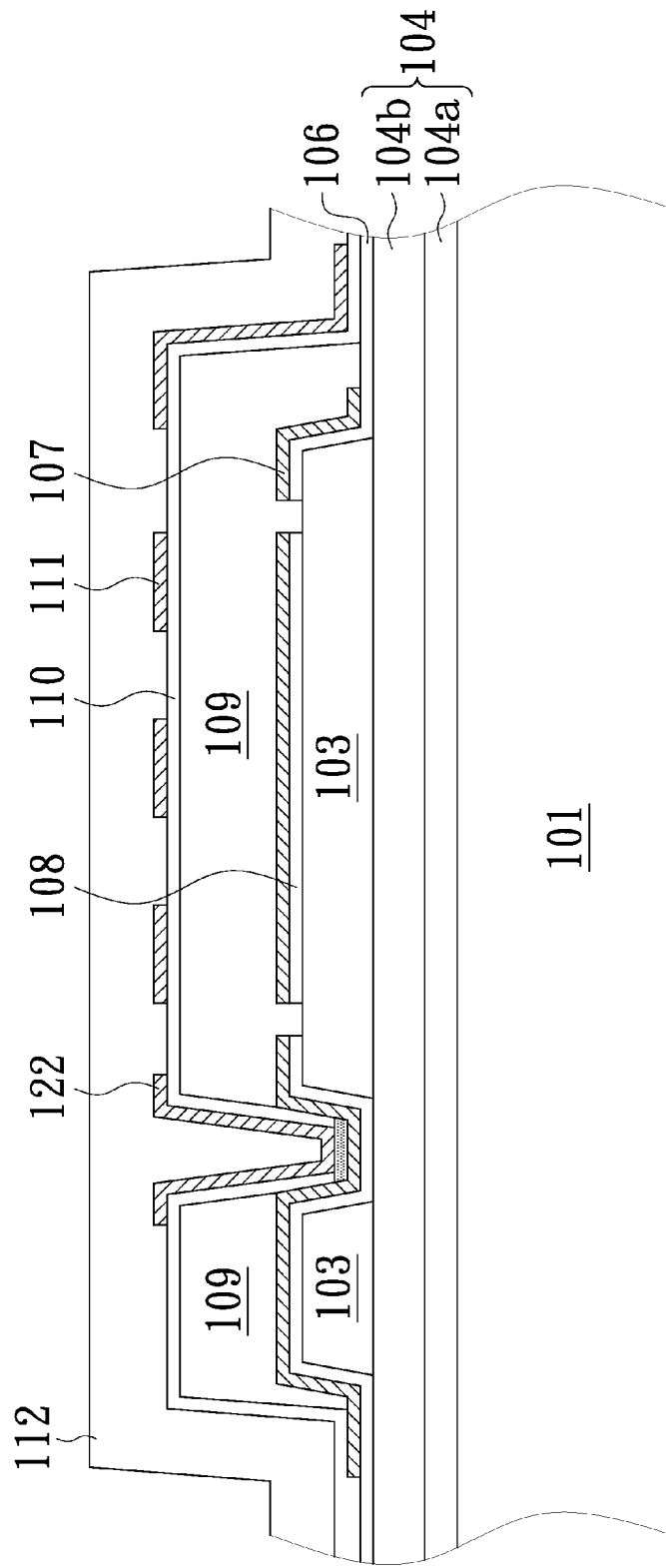
Figure 1K:
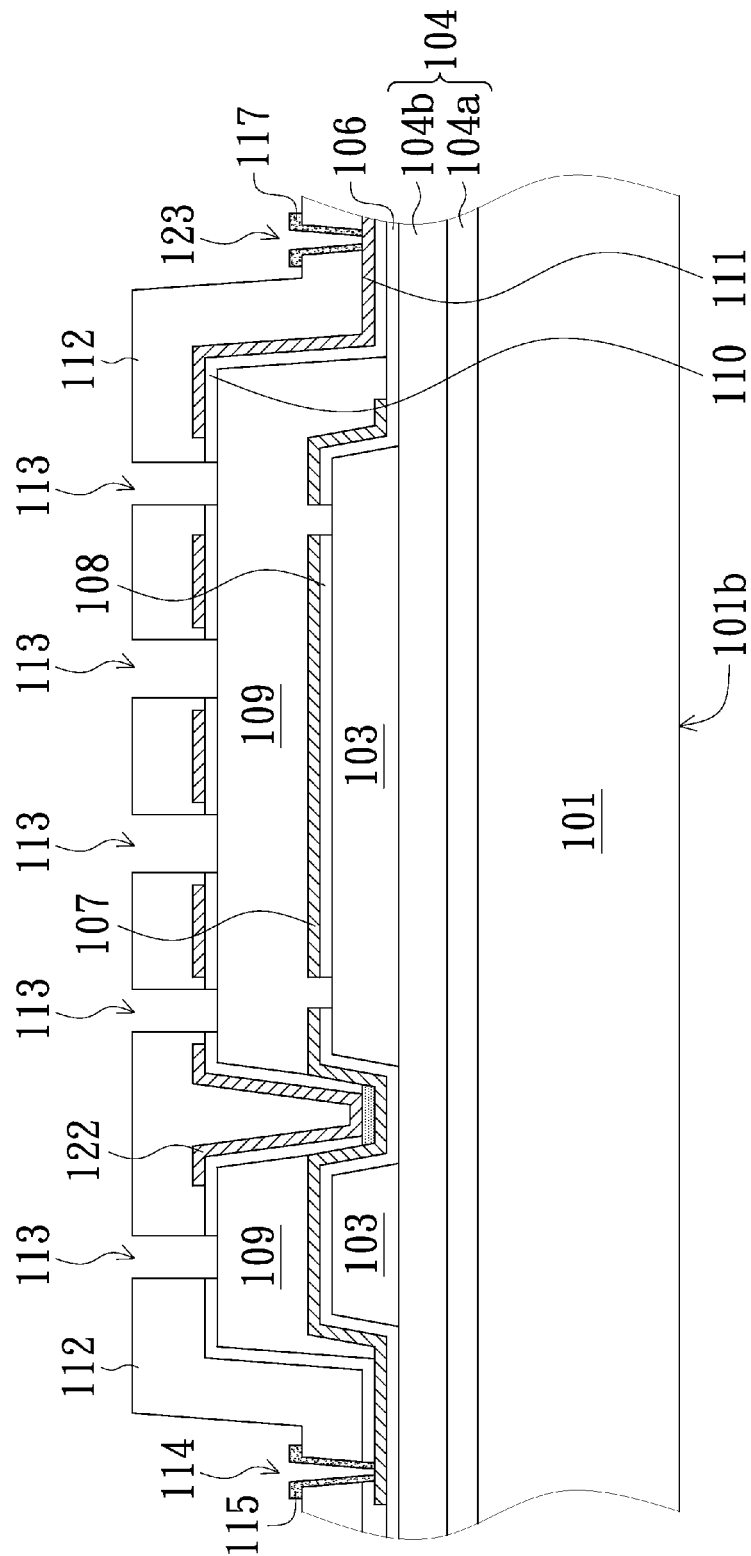

Subsequently, an etching process is performed to remove a portion of the silicon nitride layer 106 by using the patterned polyimide film 103 as the stop layer in order to define a resonance film 108 disposed on the patterned polyimide film 103 and to make a portion of the patterned polyimide film 103 exposed via the openings 107a (see FIG. 1H)

Thereafter, another patterned polyimide film 109 is formed to blanket over a portion of the patterned electrode layer 107 and the silicon nitride layer 106, so as to fill the openings 107a and to make the patterned polyimide film 109 in contact with the patterned polyimide film 103.

The formation of the patterned polyimide film 109 is similar to the way for fabricating the patterned polyimide film 103. Wherein a spin coating process is firstly performed to form a polyimide film on the patterned electrode layer 107 and the silicon nitride layer 106. After a curing step is carried out, the polyimide film is then subjected to a wet planarization process. Subsequently, a photolithographic process is performed to pattern the planarized polyimide film, so as to form the patterned polyimide film 109 having at least one through hole 109a. In the present embodiment, a portion of the patterned electrode layer 107 is exposed from the through hole 109a (see FIG. 1I).

Next, a silicon nitride layer 110 is formed to blanket over the patterned polyimide film 109 and the silicon nitride 106. Another patterned electrode layer 111 is then formed on the silicon nitride layer 110; an interconnection structure 122 is formed in the through hold 109a in order to electrically connect the patterned electrode layer 107 to the patterned electrode layer 111; and another silicon nitride layer 112 is formed to blanket over the patterned electrode layer 111 and the silicon nitride layer 110 (see FIG. 1J).

Subsequently, an etching process is performed on the silicon nitride layer 112 by using the patterned polyimide film 109 as the stop layer, whereby a plurality of through holes 113 are formed in the silicon nitride layer 112 in order to expose a portion of the patterned polyimide film 109. Several etching processes are then performed by using the patterned electrode layers 107 and 111 as the stop layers, whereby a plurality of through holes, such as through holes 114 and 123 are formed in the silicon nitride layer 112 to expose portions of the patterned electrode layers 107 and 111 respectively. And a plurality conductive pads, such as metal pads 115 and 117, are formed on the exposed patterned electrode layers 107 (see FIG. 1K).

Figure 1L:
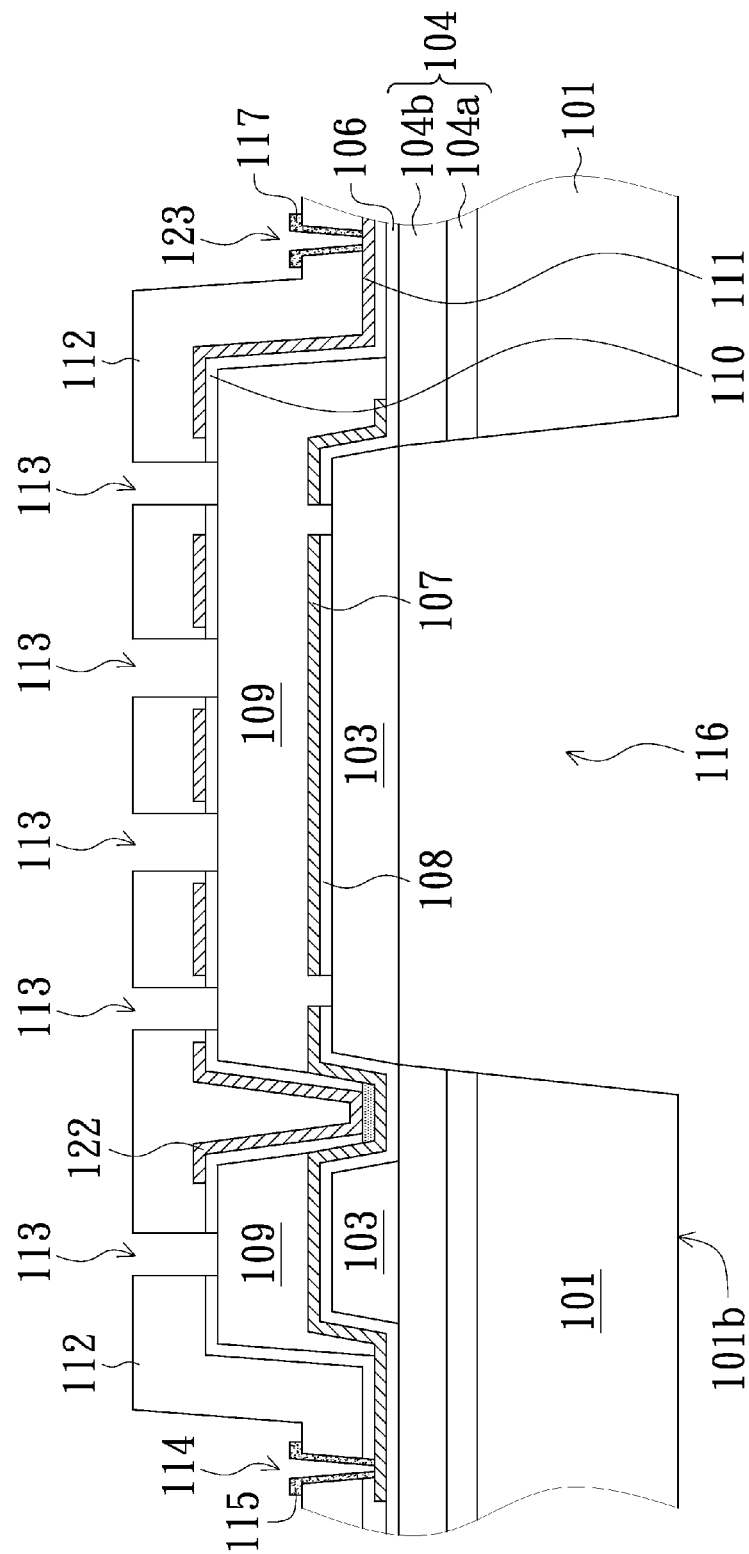

Another etching process, such as a inductive coupling plasma (ICP) etching process, is then performed on a surface 101b of the substrate 101 opposite to the surface 101a by using the pattern polyimide film 103 as the stop layer in order to remove portions of the substrate 101 and the base layer 104, whereby a through hole 116 is formed in the substrate 101 and the base layer 104 from which a portion of the pattern polyimide film 10 is exposed (see FIG. 1L).

Figure 1M:
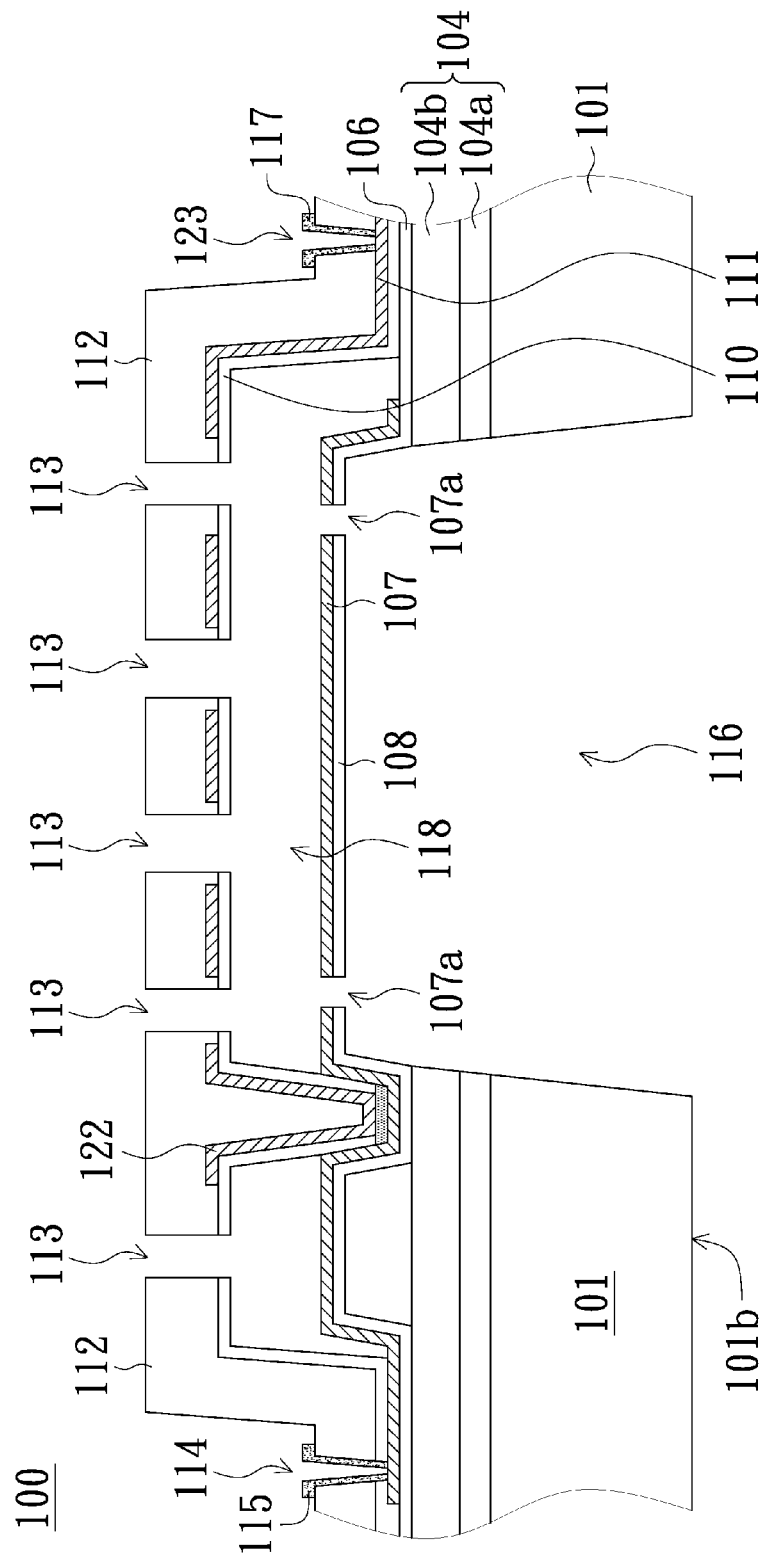

Thereafter, a buffer oxidation etchant (BOE) solution is introduced via the through hole 116 and the opening 107a in order to thoroughly remove the patterned polyimide layers 103 and 109, whereby the through hole 116, the opening 107a and the through hole 113 are interconnected with each other, and a space 118 is defined between the resonance film 108 and the silicon nitride layer 110 (see FIG. 1M). Meanwhile, the MEMS micro-microphone device 100 is completed.

In the present embodiment, the space 118 may serve as the air gap of the MEMS micro-microphone device 100; the through holes 113 interconnected to the space 118 may serve as the acoustic hole 104a of the MEMS micro-microphone device 100; the portion of the patterned electrode layer 107 may serve as the vibrating diaphragm electrode of the MEMS micro-microphone device 100; and the patterned electrode layer may serve as the fixed electrode plate of the MEMS micro-microphone device 100.

However, it should be appreciated that although the patterned polyimide films 103 and 109 of the present embodiment serve as the sacrifice layers for fabricating the MEMS micro-microphone devices 100, but it is not intended to limit the present invention. In some other embodiments, the patterned polyimide film 103 and 109 formed by the aforementioned method may serve as the resonance film of the MEMS micro-microphone device 100.

In addition, besides being applied for forming the MEMS micro-microphone devices 100, the aforementioned patterned polyimide films 103 and 109 and the fabricating method thereof may be also applied for forming other MEMS devices such as micro-acoustical sensors, micro-gyro sensors, accelerometers or clock generation and oscillators other than the MEMS micro-microphone devices 100.

In accordance with aforementioned embodiments, a method for fabricating a patterned polyimide film of a semiconductor is provided, wherein a wet planarization process is performed before a photolithographic process carried out on a polyimide film, so as to provide a planarized surface of the polyimide film allowing a photo-resist layer formed thereon, such that the pattern of the photo-resist defined by a subsequent development step may not be deformed, and the performance of the photolithography process for patterning the polyimide film and the subsequent processes carried out thereon may be improved. Therefore, the drawbacks and problems encountered from the prior art may be obviate, and the yield of the semiconductor device may be increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

The invention claimed is:

1. A method for fabricating a patterned polyimide film, comprising steps as follows:
   providing a polyimide film on a substrate;
   performing a wet planarization process that comprises performing a surface treating process to make the polyimide film being subjected to an agent comprising N-methylpyrrolidone (NMP), 8-Quinolinol, N-N Dimethylacetamide, N-Methylethanolamide, dimethylformamide (DMF), m-cresol, tetrahydrofuran (THF), chloroform, butyrolactone, cycloxanone, acetone or the arbitrary combination thereof to remove a portion of the polyimide film; and
   patterning the planarized polyimide film.

2. The method according to claim 1, wherein the polyimide film is provided by a spin coating followed by a curing step.

3. The method according to claim 1, wherein the process for patterning the planarized polyimide film comprises steps as follows:
   forming a patterned photo-resist layer on the planarized polyimide film; and
   removing a portion of the planarized polyimide film by using the patterned photo-resist layer as an etching mask.

4. The method according to claim 3, wherein the process for patterning the planarized polyimide film comprises steps of providing a bottom anti-reflective coating (BARC) layer disposed between the planarized polyimide film and the patterned photo-resist layer.

5. The method according to claim 3, wherein the process for patterning the planarized polyimide film comprises steps of providing a top-anti-reflective coating (TARC) layer on the patterned photo-resist layer.

6. The method according to claim 3, wherein the portion of the planarized polyimide film is removed by a dry etching process or a wet etching process.

7. The method according to claim 1, wherein the patterned polyimide film serves as a sacrifice film for forming a micro-microphone or as a resonance film of the micro-microphone.

8. The method according to claim 1, wherein the polyimide film is a photo-insensitive film.

* * * * *